United States Patent
Horch et al.

(10) Patent No.: US 6,683,330 B1
(45) Date of Patent: Jan. 27, 2004

(54) RECESSED THYRISTOR CONTROL PORT

(75) Inventors: Andrew Horch, Sunnyvale, CA (US); Scott Robins, San Jose, CA (US)

(73) Assignee: T-Ram, Inc., San Jose, CA (US)

( * ) Notice: Subject to any disclaimer, the term of this patent is extended or adjusted under 35 U.S.C. 154(b) by 0 days.

(21) Appl. No.: 10/262,697

(22) Filed: Oct. 1, 2002

(51) Int. Cl.$^7$ .................. H01L 29/74; H01L 31/111

(52) U.S. Cl. .................. 257/133; 257/146; 257/163; 257/170

(58) Field of Search .................. 257/118, 133, 257/146, 163, 170

(56) References Cited

U.S. PATENT DOCUMENTS

| | | | |
|---|---|---|---|
| 6,081,002 A | 6/2000 | Amerasekera et al. | |
| 6,104,045 A | 8/2000 | Forbes et al. | |
| 6,225,165 B1 | 5/2001 | Noble, Jr. et al. | |
| 6,229,161 B1 * | 5/2001 | Nemati et al. | 257/133 |
| 6,492,662 B2 * | 12/2002 | Hsu et al. | 257/124 |

OTHER PUBLICATIONS

Stanley Wolf Ph.D. and Richard N. Tauber Ph.D., *Silicon Processing for the VLSI Era*, vol. 1, 1986, pp. 285–286.

K. DeMeyer, S. Kubicek and H. van Meer, *Raised Source/Drains with Disposable Spacers for sub 100 nm CMOS technologies*, Extended Abstracts of International Workshop on Junction Technology 2001.

Mark Rodder and D. Yeakley, *Raised Source/Drain MOSFET with Dual Sidewall Spacer* IEEE Electron Device Letters, vol. 12, No. 3, Mar. 1991.

Yang–Kyu Choi, Daewon Ha, Tsu–Jae King and Chenming Hu, *Nanoscale Ultrathin Body PMOSFETs With Raised Selective Germanium Source/Drain*, IEEE Electron Device Letters, vol. 22, No. 9, Sep. 2001.

N. Lindert, Y.–K. Choi, L. Chang, E. Anderson, W.–C. Lee, T.–J. King, J. Bokor, and C. Hu, *Quasi–Planar FinFETs with Selectively Grown Germanium Raised Source/Drain*, 2001 IEEE International SOI Conference, Oct. 2001.

T. Ohguro, H. Naruse, H. Sugaya, S. Nakamura, E. Morifuji, H. Kimijima, T. Yoshitomi, T. Morimoto, H.S. Momose, Y. Katsumata, and H. Iwai, *High Performance RF Characteristics of Raised Gate/Source/Drain CMOS with Co Salicide*, 1998 Symposium on VLSI Technology Digest of Technical Papers.

(List continued on next page.)

*Primary Examiner*—Ngân V. Ngô

(57) ABSTRACT

A semiconductor device is formed including a substrate having an upper surface, a thyristor region in the substrate and a control port adapted for capacitively coupling to at least a portion of the thyristor region via a dielectric material. According to an example embodiment of the present invention, a trench is formed in the substrate and subsequently filled with materials including dielectric material and a control port. The control port is adapted for capacitively coupling to the thyristor via the dielectric material for controlling current flow in the thyristor (e.g., for causing an outflow of minority carriers from a portion of the thyristor for switching the thyristor from conducting state to a blocking state). A portion of the substrate adjacent to the upper surface is implanted with a species of ions, and the dielectric material via which the control port capacitively couples to the thyristor does not include the species of ions. In one implementation, a filled portion of the trench over the control port inhibits ions from implanting the dielectric material. In another implementation, the control port is formed recessed, relative to the upper surface of the substrate, such that the ion implant depth of the region adjacent to the upper surface is shallower than the recessed control port. With this approach, current control in the thyristor is effected using an arrangement that inhibits ion implantation damage to dielectric material used for controlling current in the thyristor.

17 Claims, 7 Drawing Sheets

OTHER PUBLICATIONS

Hsiang–Jen Huang, Kun–Ming Chen, Tiao–Yuan Huang, Tien–Sheng Chao, Guo–Wei Huang, Chao–Hsin Chien, and Chun–Yen Chang, *Improved Low Temperature Characteristics of P–Channel MOSFETs with $Si_{1-x}Ge_x$ Raised Source and Drain*, IEEE Transactions on Electron Devices, vol. 48, No. 8, Aug. 2001.

Plummer, James D. and Scharf, Brad W., *Insulated–Gate Planar Thyristors: I–Structure and Basic Operation*, pp. 380–386.

Christopher J. Petti, and James D. Plummer, *The Field–Assisted Turn–Off Thyristor: A Regenerative Device with Voltage–Controlled Turn–Off*.

* cited by examiner

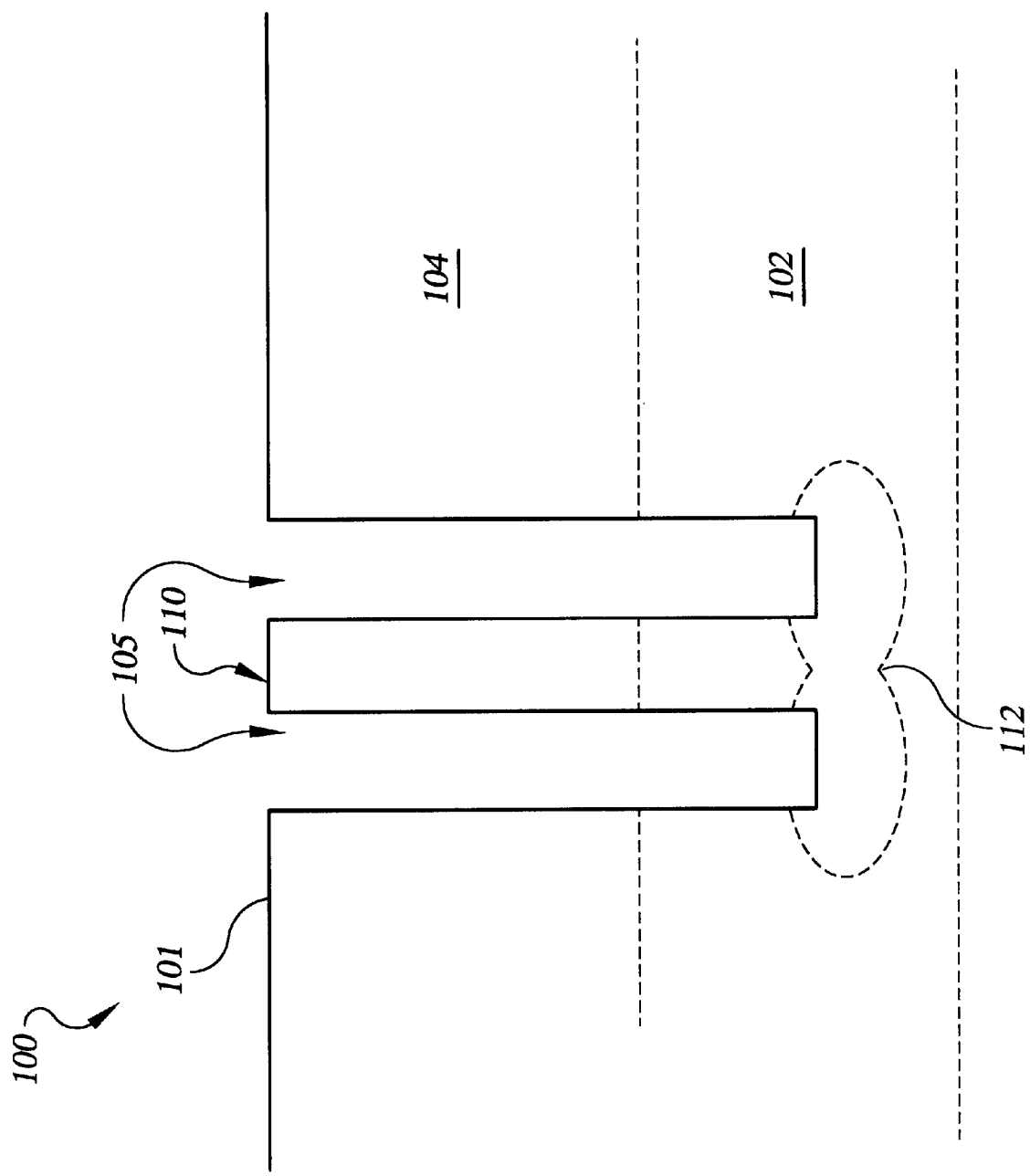

RECESSED THYRISTOR CONTROL PORT

RELATED PATENT DOCUMENTS

This document is related to U.S. patent application Ser. No. 10/262,721 (TRAM.014PA), entitled "Trench Isolation for Thyristor-based Device," filed concurrently herewith and fully incorporated herein by reference.

Field of the Invention

The present invention is directed to semiconductor devices and, more specifically, to thyristor-based semiconductor devices, such as thyristor-based memory devices and other thyristor-based current-switching circuits.

Background

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for thyristor-based applications. An important consideration in the design of the thin capacitively-coupled thyristor device involves designing the body of the thyristor sufficiently thin, so that the capacitive coupling between the control port and the thyristor base region can substantially modulate the potential of the base region. Another important consideration in semiconductor device design and manufacture, including the design and manufacture of devices employing thin capacitively coupled thyristor-type devices and memory circuits, includes manufacturing the device without changing the structure of or otherwise damaging the device. For example, when circuit regions are ion implanted, adjacent circuit regions can sometimes be undesirably implanted and, in some instances, this undesirable implantation can damage the device being manufactured. For instance, dielectric materials, such as those employed between gate electrodes and channel regions, are susceptible to ion implant damage.

These and other design considerations have presented challenges to efforts to implement such a thin capacitively-coupled thyristor in bulk substrate applications, and in particular to applications susceptible to ion implant damage.

SUMMARY

The present invention is directed to overcoming the above-mentioned challenges and others related to the types of devices and applications discussed above and in other circuits, such as memory circuits. The present invention is exemplified in a number of implementations and applications, some of which are summarized below.

According to an example embodiment of the present invention, a semiconductor device includes a thyristor having a control port and a body region in a substrate, the control port being separated from the body region by a dielectric material. The control port is recessed from a dopable region of the substrate, such that ion-implantation of the dopable region does not implant the dielectric material between the control port and the body region. With this approach, challenges to the manufacture and implementation of semiconductor devices, including those discussed above, are addressed.

In one specific example approach, a trench is etched in a semiconductor substrate that has at least one region of a thyristor and a dopable region therein. A dielectric material is formed on a sidewall of the trench facing the at least one thyristor region, and a control port is formed in the trench and recessed below the dopable region, relative to an upper surface of the substrate. The control port is adapted for capacitively coupling to the thyristor region via the dielectric material for controlling current flow in the thyristor. Filler material is formed in the trench and over the control port. The dopable region is subsequently implanted while using material above the control port and in the substrate, such as the filler material and/or portions of the thyristor, to inhibit the implantation of a portion of the dielectric material (e.g., via which the thyristor is adapted for capacitively coupling).

In another example embodiment of the present invention, a semiconductor device includes a thyristor and a substrate having an upper surface. The thyristor includes a control port and at least one body region that is in the substrate. The control port is in a filled trench that is adjacent to the thyristor body region and includes a dielectric material on a portion of a sidewall thereof. The control port has an uppermost portion recessed below the upper surface of the substrate and is adapted for capacitively coupling to the thyristor body region in the substrate via a portion of the dielectric material extending alongside the control port and below the uppermost portion. A region of the substrate adjacent to the upper surface includes a species of ions implanted therein, wherein the dielectric material portion extending alongside the control port and below the uppermost portion of the control port does not include the species of ions.

In a more particular implementation, the control port is adapted for capacitively coupling at least one voltage transition to the at least one thyristor region in the substrate. The capacitive coupling causes an outflow of minority carriers from the at least one thyristor region and switches the thyristor at least from a current-passing mode to a current-blocking mode for current flow in the thyristor body.

In another example embodiment of the present invention, a memory cell is formed having a thyristor-based device having a control port recessed below a doped portion in a substrate, such as those discussed above. The thyristor-based device includes a thyristor that is electrically coupled in series with a pass device, and the pass device and thyristor are adapted for read and write access for memory storage.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIGS. 1A–D show cross-sectional views of a thyristor-based semiconductor device at various stages of manufacture, according to an example embodiment of the present invention, where FIG. 1A shows a trench being etched in a substrate that is implanted via the trench;

FIG. 1B shows portions of the trench being filled;

FIG. 1C shows portions of the substrate being doped; and

FIG. 1D shows portions of a pass device and circuit connectors being formed;

Figure 1B:
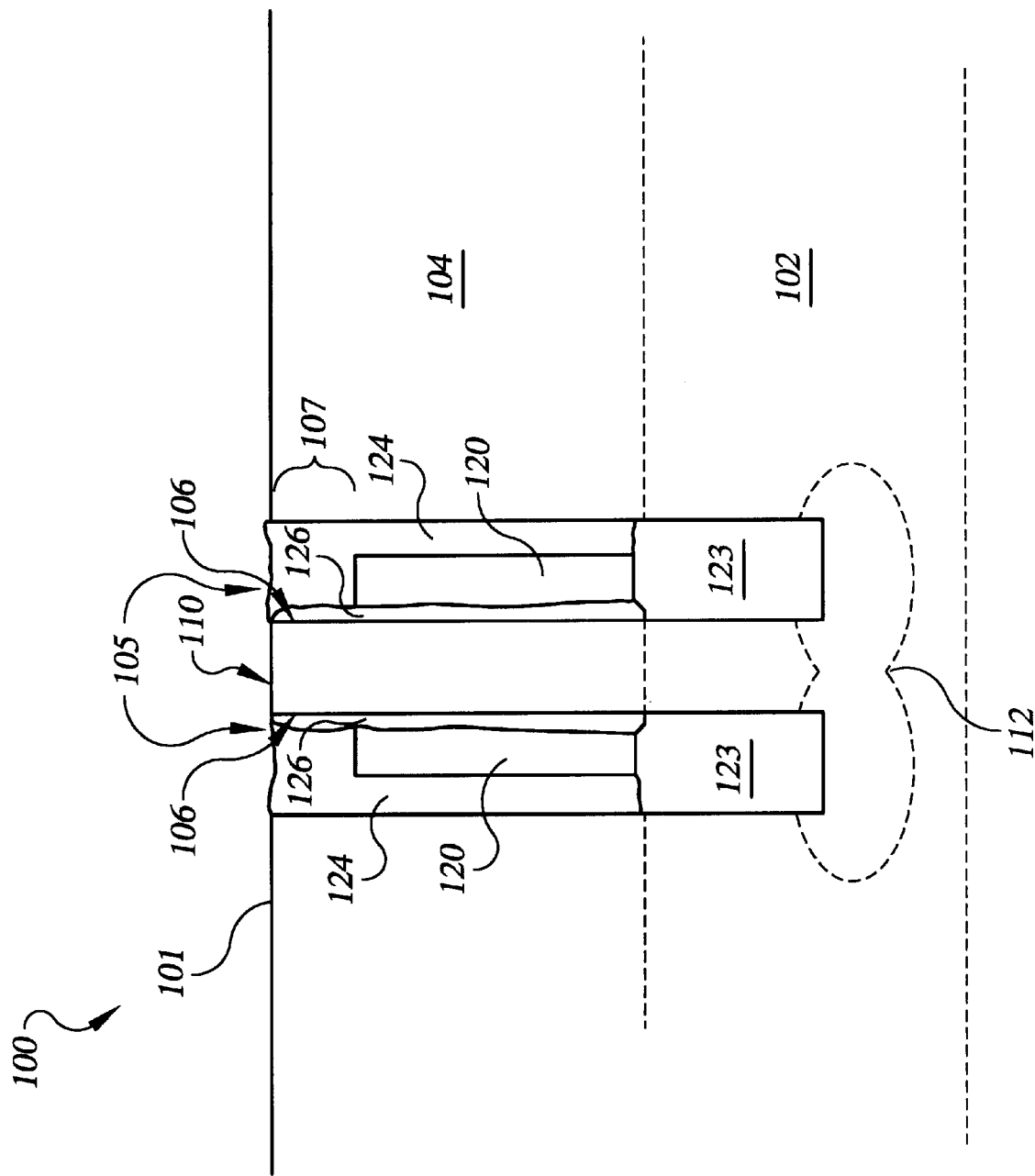

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has been found to be particularly useful for thyristor-based applications (including memory devices) susceptible to ion implant damage. While the present invention is not necessarily limited to such applications, various aspects of the invention may be appreciated through a discussion of various examples using this context.

According to an example embodiment of the present invention, a thyristor-based (i.e., thyristor- including) semiconductor device is formed having a thyristor control port recessed from a dopable region and prior to the dopable region being ion implanted. The control port is separated from a thyristor region in the substrate by a dielectric material and adapted for capacitively coupling to the thyristor region via the dielectric material. The degree to which that the control port is recessed, relative to the dopable region, is selected to inhibit ion implantation of the dielectric material during subsequent ion implantation of the dopable region. For instance, in one implementation, the dopable region is part of an emitter region of the thyristor body, and in another implementation, the dopable region is part of an active region of an adjacent device, such as a pass device. With this approach, ions implanted to the dopable portion are inhibited from implanting the dielectric material and causing damage thereto (e.g., such that the dielectric material does not include the species of ions implanted into the dopable portion).

In one particular implementation, the control port is formed in a trench that is adjacent to a thyristor body region in a semiconductor substrate having an upper surface, where the thyristor body is part of a thin capacitively-coupled thyristor including the control port. The control port is adapted for capacitively coupling to a portion of the thyristor body region via a dielectric material in the trench, and is recessed from the upper surface of the substrate. A portion of the substrate adjacent to the trench and the upper surface is ion implanted to form one or more of an emitter region of the thyristor and/or an active region of a pass device. The depth to which control port is recessed from the upper surface is selected such that the control port is sufficiently distanced from the ion-implanted portion to inhibit ion implantation of a portion of the dielectric material between the control port and the thyristor body. More specifically, the control port is recessed deeper below the surface than the depth to which the substrate is ion implanted, while maintaining the control port's ability to control current flow in the thyristor.

In one implementation, an upper portion of the trench over the control port is filled with a filler material. The filler material is adapted for inhibiting ions from implanting a portion of the dielectric material. In another implementation, other material in the substrate, such as a portion of the thyristor or other device, absorbs ions implanted into the substrate and inhibits and/or prevents the ions from implanting the dielectric material.

In another example embodiment, the control port is arranged for capacitively coupling at least one voltage pulse to the thyristor body. The capacitively-coupled voltage pulse causes an outflow of minority carriers from the thyristor body and switches the thyristor between conducting states. For instance, the voltage pulse can be implemented for switching the thyristor between a current-passing mode and a current-blocking mode. For more information regarding thyristor devices, and for specific information regarding controlling current flow in a thyristor in a manner that is applicable for use in connection with this and/or other example embodiments herein, reference may be made to U.S. Pat. No. 6,229,161, which is fully incorporated herein by reference.

FIG. 1A shows a cross-sectional view of a thyristor-based semiconductor device 100 at initial manufacturing stages, according to another example embodiment of the present invention. The device 100 includes a substrate having a first P-doped substrate region 104 and a second N-doped substrate region 102 below an upper surface 101. A trench 105 is etched through the first P-doped substrate region 104, into the second N– doped substrate region 102 and around a dopable thyristor region 110. A portion of the second N-doped substrate region 102 below the trench 105 is implanted to form a P+ emitter region 112 near a bottom portion of the thyristor region 110.

In FIG. 1B, a filler material 123, such as an insulator, is formed in a bottom portion of the trench 105, and a dielectric material 126 is formed on a sidewall 106 of the trench. A control port 120 is then formed in the trench 105 and separated from the thyristor region 110 by the dielectric material 126. Additional filler material 124 is then used to fill the remaining portion of the trench 105, with a portion of the filler material and the dielectric material 126 filling an upper portion 107 of the trench over the control port 120.

The order of the formation of the dielectric material, the control port and the filler material 124 can be changed to suit selected applications. For instance, the filler material 124 can be formed in the trench, prior to forming the control port and/or the dielectric material. A portion of the filler material is then etched where the control port and/or dielectric material is to be formed, and the control port and/or dielectric material is then formed in the etched region. Additional filler material is then formed over the control port and the dielectric material in the upper portion 107 of the trench.

Figure 1C:
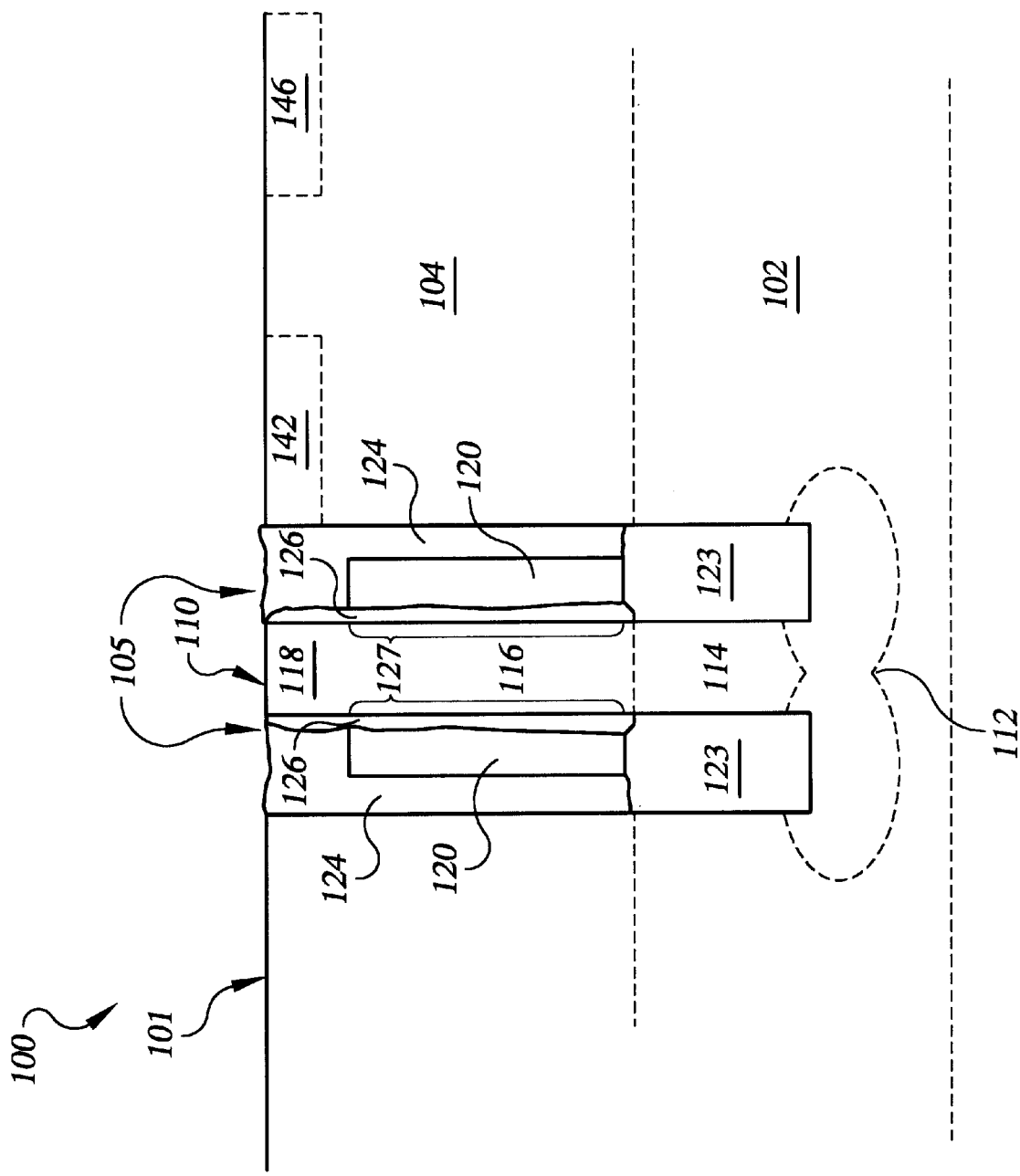

In FIG. 1C, the thyristor region 110 is doped to complete the formation of the thyristor body; thus, the doping is performed to form an N base region 114, a P base region 116 and an N+ emitter region 118 (e.g., using ion implantation). The control port 120 is sufficiently recessed below the upper surface 101 of the substrate so that the N+ doping of the emitter region 118 does not dope a portion 127 of the dielectric material 126 that is laterally between the control port 120 and the P base region 116. In one instance, filler material including a portion of the filler material 124 and the dielectric material 126 inhibits ions from implanting the portion 127 of the dielectric material 126. Ions implanted in the N+ emitter region 118 therefore do not implant the portion 127 of the dielectric material 126, either via an upper portion of the trench 105 or via a lower region of the emitter region 118.

N+ source/drain regions 142 and 146 are also formed in the substrate, either concurrently with or in a step separate from the formation of the N+ emitter region 118. The depth to which the control port 120 is recessed below the upper surface 101 is also sufficient to inhibit the implanting of the dielectric material during the formation of the N+ source/drain region 142. The resulting thyristor structure includes a thyristor body having P+ emitter region 112, N base region 114, P base region 116 and N+ emitter region 118. In addition, the thyristor also includes the control port 120, which is adapted for capacitively coupling to the P base region 116 via a portion of the dielectric material region 126 between the control port and the P base region.

Figure 1D:
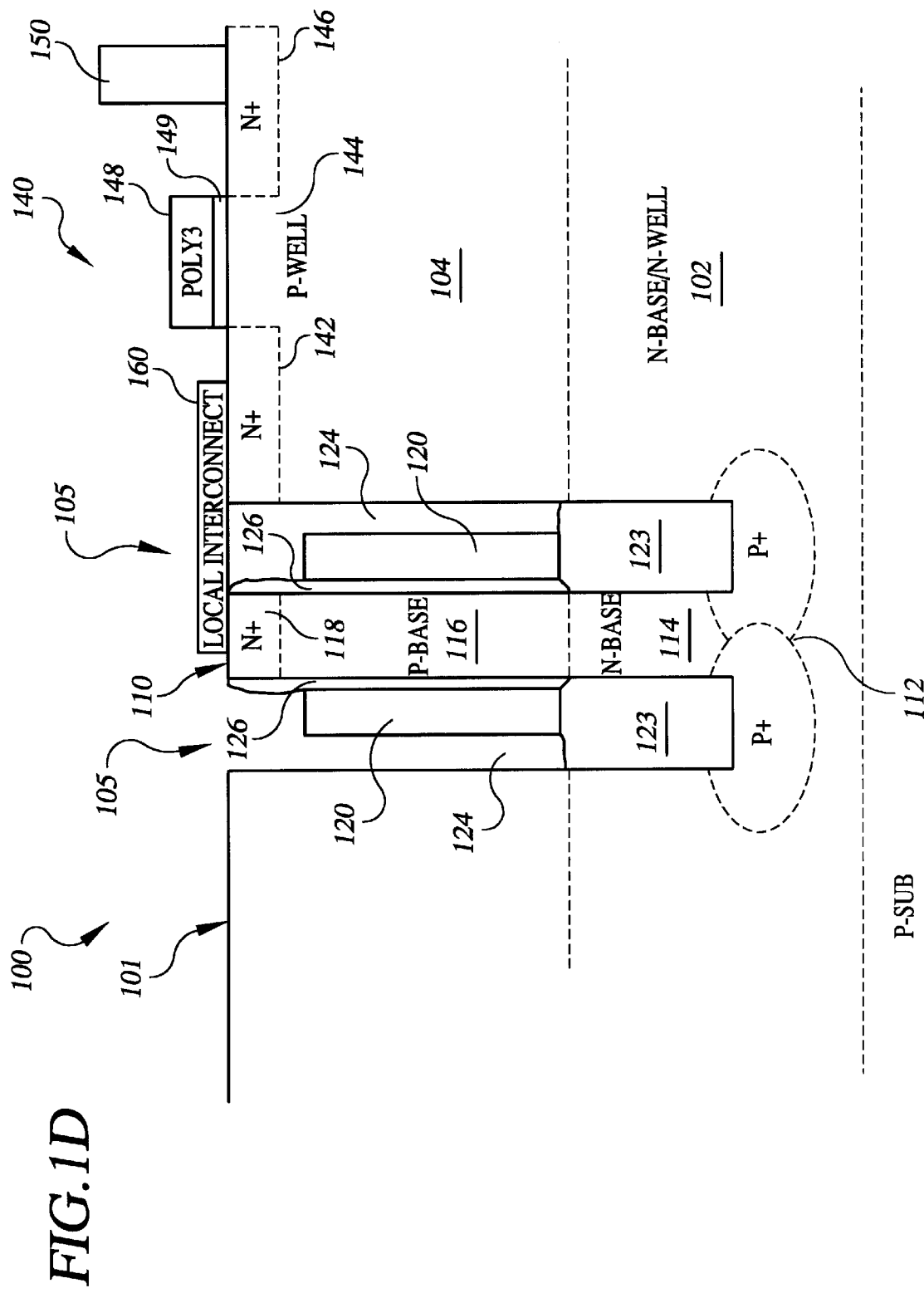

In FIG. 1D, a dielectric material 149 is formed over a portion of the P substrate region 104 between the N+ source/drain regions 142 and 146, and a gate electrode 148 is formed over the dielectric material 149. The gate electrode 148 and source/drain regions 142 and 146 are adapted to form a pass device 140. A local interconnect 160 is formed over a portion of the trench 105 and is used to electrically couple the N+ emitter region 118 of the thyristor in series with the N+ source drain region 142 of the pass device 140. A bit line metal conductor 150 is coupled to the source/drain region 146, and the P+ emitter region 112 is coupled to a source (not shown) adapted to provide a reference voltage to the emitter region.

The doping order of the thyristor regions and the substrate in FIGS. 1A–1D, as discussed above, is adjusted for particular applications. In one particular implementation, the N base region 114 is doped at the same time as the N substrate region 102. In another particular implementation, P base region 116 is doped at the same time as P substrate region 104. In addition, the doping is effected before or after the etching of the trench 105, depending upon the application. In each of these implementations, ion implantation of the dielectric material via which the control port is adapted for capacitively coupling to the thyristor is inhibited.

In one particular implementation, the device 100 in FIG. 1D is adapted for use as a memory cell for storing information as a condition of the state of the N+ emitter region 118. The gate 148 is formed as part of a first word line (WL1) and the control port 120 is formed as part of a second word line (WL2). The device is adapted for read and write access to the N+ emitter region 118 that is controlled via word lines WL1 and WL2 and bit line 150, which respectively control conductive paths between the N+ emitter region 118 and the reference voltage at the P+ emitter region 112 and the bit line 150. The memory cell can be used, for example, in computer and embedded memory applications.

Figure 1E:
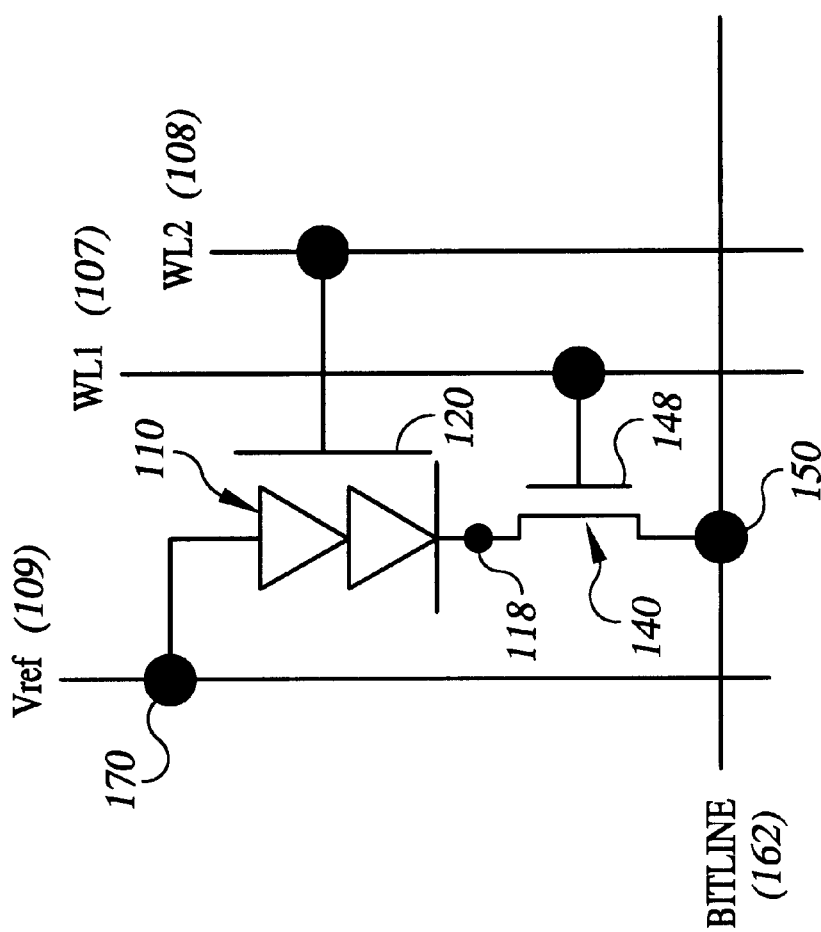
FIG. 1E is a circuit including a thyristor-based device, such as the device shown in FIG. 1D, according to another example embodiment of the present invention.

The present invention is applicable to a variety of devices and circuit arrangements. FIG. 1E is one such circuit arrangement 100, according to a more particular example embodiment of the present invention. The circuit arrangement 100 may include, for example, the circuit formed in FIGS. 1A–1D, and includes a thyristor body 110 and a pass device 140 (e.g., transistor) electrically coupled in series. Data is stored as a function of the conductance state of the thyristor, relative to the state at storage node 118 (e.g., wherein latched "on" and "off" states of the thyristor respectively correspond to a logical "one" and "zero"). Control ports 120 and 148 are adapted to control current flow in the thyristor body 110 and the pass device 140, respectively, in response to signals applied to first (WL1) and second (WL2) word lines 107 and 108. A contact 170 is adapted to electrically couple a signal from a reference voltage (Vref) line 109 to a buried emitter region of the thyristor body region 110. In addition, a bit line contact 150 is adapted to electrically couple a signal from a bit line 162 to a source/drain region of the pass device 140. The thyristor control port is recessed in a substrate below the storage node 118 and a source/drain region of the pass device 140.

In response to signals applied to WL1 and WL2, and using signals at the bit line 162 and Vref line 109, the device 100 is adapted for writing data to and/or reading data from the storage node 118. For example, when the thyristor is latched in an "on" state and the first word line 107 is pulsed (with the second word line 108 not being pulsed), an output pulse is coupled to the bit line contact 150 for a read "one." When the thyristor is latched in an "off" state and the first word line 107 is pulsed (again with the second word line 108 not being pulsed), no output pulse is seen on the bit line contact 150 for a read "zero."

Figure 2:
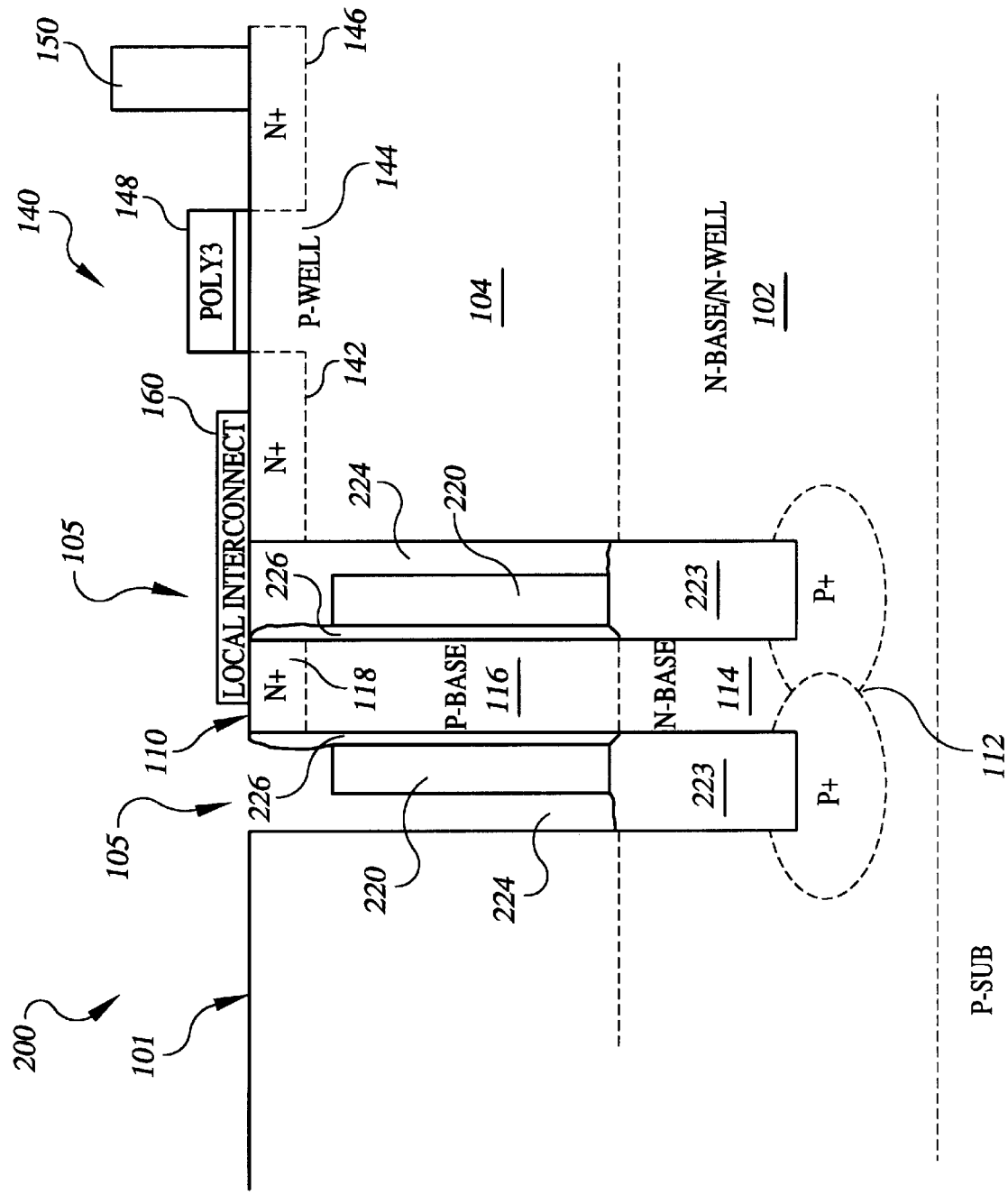
FIG. 2 is a cross-sectional view of another thyristor-based semiconductor device, according to another example embodiment of the present invention.

FIG. 2 shows a thyristor-based semiconductor device 200, similar to the device 100 in FIGS. 1A–1D, according to another example embodiment of the present invention. Features in FIG. 2 that are similar to those shown in FIGS. 1A–1D are similarly labeled, with discussion thereof omitted below for brevity. The thyristor based device 200 is formed having a control port 220 recessed from the N+ emitter region 118 and the N+ source/drain region 142, as is the control port 120 in FIG. 1D. However, the control port 220 is also recessed from the N base region 114. Specifically, after the trench 105 is etched, filler material 223 is formed in the trench, a gate dielectric material 226 and a control port 220 are formed over the filler material. The control port 220 is formed to underlap the N-doped regions 114 and 102. As shown, the control port does not extend vertically above or below the P base region 116 and thus does not overlap either of the thyristor regions 114 and 118 contiguously adjacent to the P base region.

The underlap of the control port relative to the N base region 114 is achieved via the formation of one or both of the control port and the N base region 114. For instance, in one implementation, the N base region 114 is doped so that it extends to a portion below a bottom portion of the control port. In another implementation, the control port 220 is formed extending to a depth that is above an upper portion of the N base region 114. This can be achieved, for example, by using additional filler material 223 to fill more of the trench, prior to forming the control port or by completely filling the trench with filler material 223 and subsequently etching back the filler material so that it is not recessed below N base region 114.

Figure 3:
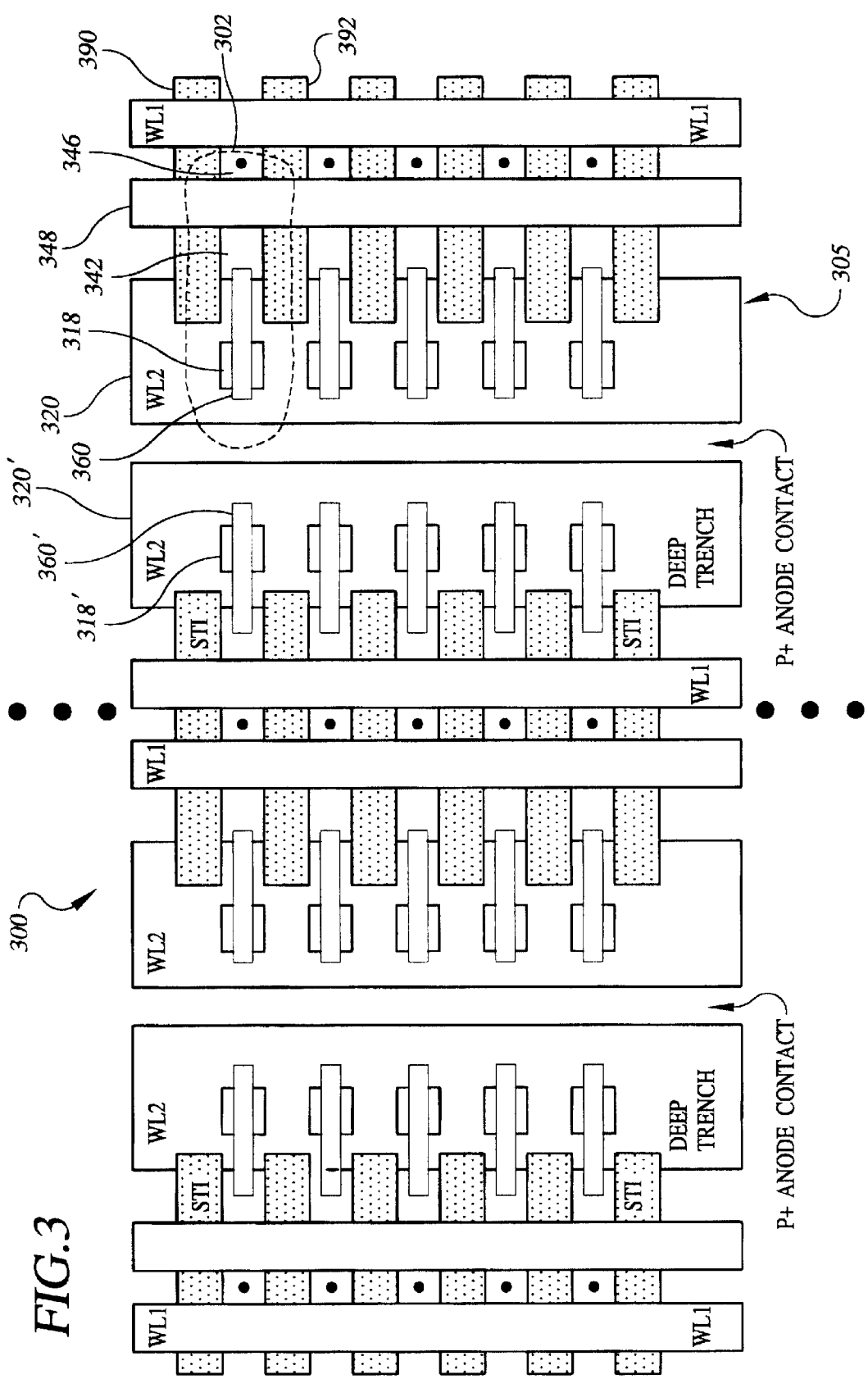
FIG. 3 is an overview of a memory array having a plurality of thyristor-based semiconductor devices, such as those shown in the preceding figures, according to another example embodiment of the present invention.

The example embodiments described herein are applicable to a variety of applications. FIG. 3 shows one such application having a plurality of thyristor-based devices that form a memory array 300, according to another example embodiment of the present invention. The various characteristics of the memory array 300 are numbered to correspond to those numbers used in the Figures described above, where applicable. In this regard, the discussion above of the thyristor based semiconductor devices may also be applied to the memory array 300 for one or more applications.

The memory array 300 includes memory cells, including cell 302 (outlined by dotted lines), separated by shallow trench isolation (STI) 390 and 392 from adjacent memory cells, where each cell is adapted to store information. Using cell 302 as an example, word line 348 forms the gate of a pass device having source/drain regions 342 and 346 (e.g., similar to source/drain regions 142 and 146 of FIG. 1D). The cell 302 further includes a thyristor having vertical portions with an N+ anode region 318 at an upper portion and coupled in series with the pass device via local interconnect 360. The thyristor is coupled to a control port 320 formed in a trench 305 around the thyristor. The trench 305 further includes a filled lower portion including an insulator material, a dielectric material adjacent to the thyristor, and another insulator material adjacent to the control port 320, such as materials 123, 126 and 124, respectively, of FIG. 1D. The arrangement of the control port 320, as with control port 120 of FIG. 1D, is selected to inhibit ion implantation of dielectric material between the control port and the thyristor body region 110.

As an alternative approach, any of the above embodiments can be modified using the approach(es) illustrated and described in concurrently-filed U.S. Provisional Patent Application Ser. No. 60/415,356, entitled "Novel Minority Carrier Isolation Device."

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes (e.g., recessing only the portion of the WL2 closest to the gate dielectric material while allowing a portion of the WL2 to be above the doped region), locations, and sizes of the illustrated thyristors and shunts; adding structures to the integrated circuit device; increasing the number of PN sections in the thyristor; interchanging P and N regions in the device structures and/or using PMOSFETS rather than NMOSFETS, and using metal in place of a local interconnect. In addition, for general information regarding thyristor-based applications, and for specific information regarding implementations to which the present invention is applicable, reference may be made to U.S. Pat. No. 6,229,161, dated May 8, 2001 and entitled "Semiconductor Capacitively-Coupled NDR Device And Its Applications In High-Density High-Speed Memories And In Power Switches," which is fully incorporated herein by reference. Such modifications and changes do not depart from the true spirit and scope of the present invention that is set forth in the following claims.

What is claimed is:

1. A semiconductor device including a thyristor and a substrate having an upper surface, wherein at least one region of the thyristor is in and defined by the substrate, the device comprising:

a filled trench having a sidewall in the substrate and adjacent to the thyristor region;

a dielectric material on a portion of the sidewall; and a control port in the trench and having an uppermost portion recessed below the surface of the substrate, the control port being adapted for capacitively coupling to the at least one thyristor region in the substrate via a portion of the dielectric material extending alongside the control port and below the uppermost portion thereof and for controlling current flow in the at least one thyristor region in the substrate, wherein the thyristor-based semiconductor device includes a species of ions implanted into a region adjacent to the upper surface and wherein the dielectric material portion extending alongside the control port and below the uppermost portion of the control port does not include the species of ions.

2. The semiconductor device of claim 1, wherein the control port, the dielectric material extending alongside the control port and below the uppermost portion thereof and the region adjacent to the upper surface are arranged such that ion implantation of the region adjacent to the upper surface does not implant the dielectric material extending alongside the control port and below the uppermost portion thereof.

3. The semiconductor device of claim 1, wherein the control port is recessed, relative to the upper surface of the substrate, at least as deep as the region adjacent to the upper surface.

4. The semiconductor device of claim 1, further comprising a pass device coupled in series with the thyristor and having an active region in the substrate, the active region including a portion of the region adjacent to the upper surface.

5. The semiconductor device of claim 1, wherein the thyristor includes a doped emitter region in the substrate and above the control port, the doped emitter region including a portion of the region adjacent to the upper surface.

6. The semiconductor device of claim 1, wherein the control port is adapted for capacitively coupling at least one voltage transition to the at least one body region for causing an outflow of minority carriers from said at least one body region and switching the thyristor-based semiconductor device at least from a current-passing mode to a current-blocking mode for current flow in the thyristor body.

7. The semiconductor device of claim 1, wherein the thyristor includes a first region immediately adjacent to and above the at least one thyristor region in the substrate and a second region immediately adjacent to and below the at least one thyristor region in the substrate, wherein the uppermost portion of the control port is below the first region and wherein the control port has a lowermost portion above the second region.

8. A semiconductor device comprising:

a substrate having an upper surface;

a thyristor having at least one body region in the substrate and having a control port;

a filled trench region in the substrate and adjacent to said at least one thyristor body region, the filled trench region including a dielectric material, the control port and filler material over the control port and below the upper surface of the substrate, the control port having an uppermost portion recessed below the upper surface of the substrate and being adapted for capacitively coupling to the at least one thyristor body region via a portion of the dielectric material extending alongside the control port and below the uppermost portion thereof and for controlling current flow in the thyristor, a portion of the thyristor-based semiconductor device above the control port being adapted for inhibiting ions from doping the dielectric material portion extending alongside the control port and below the uppermost portion of the control port during ion implantation of the substrate.

9. The semiconductor device of claim 8, wherein the portion of the thyristor-based semiconductor device above the control port being adapted for inhibiting ions from doping the dielectric material portion extending alongside the control port and below the uppermost portion of the control port during implantation of the substrate includes the filler material over the control port.

10. The semiconductor device of claim 8, wherein the portion of the thyristor-based semiconductor device above the control port being adapted for inhibiting ions from doping the dielectric material portion extending alongside the control port and below the uppermost portion of the control port during ion implantation of the substrate includes a thyristor region over the at least one thyristor region to which the control port is adapted for capacitively coupling to.

11. A semiconductor device comprising:

a substrate having an upper surface and a trench;

a thyristor having at least one body region in the substrate and a control port in the trench, the control port having a surface portion facing the at least one body region and separated therefrom by a dielectric material, the control port being configured and arranged for capacitively coupling at least one voltage transition to the at least one body region via the dielectric material for causing an outflow of minority carriers from said at least one body region and switching the thyristor at least from a current-passing mode to a current-blocking mode for current flow in the thyristor body; and a region in the substrate adjacent to the upper surface and implanted with a species of ions, wherein the dielectric material via which the control port is arranged to capacitively couple a signal to the at least one body region does not include the species of ions.

12. The semiconductor device of claim 8, wherein the control port, the dielectric material extending alongside the control port and below the uppermost portion thereof and the region adjacent to the upper surface are arranged such that ion implantation of the region adjacent to the upper surface does not implant the dielectric material extending alongside the control port and below the uppermost portion thereof.

13. The semiconductor device of claim 8, wherein the control port is recessed, relative to the upper surface of the substrate, at least as deep as the region adjacent to the upper surface.

14. The semiconductor device of claim 8, further comprising a pass device coupled in series with the thyristor and having an active region in the substrate, the active region including a portion of the region adjacent to the upper surface.

15. The semiconductor device of claim 8, wherein the thyristor includes a doped emitter region in the substrate and above the control port, the doped emitter region including a portion of the region adjacent to the upper surface.

16. The semiconductor device of claim 8, wherein the control port is adapted for capacitively coupling at least one voltage transition to the at least one body region for causing an outflow of minority carriers from said at least one body region and switching the thyristor-based semiconductor device at least from a current-passing mode to a current-blocking mode for current flow in the thyristor body.

17. The semiconductor device of claim 8, wherein thethyristor includes a first region immediately adjacent to and above the at least one thyristor region in the substrate and a second region immediately adjacent to and below the at least one thyristor region in the substrate, wherein the uppermost portion of the control port is below the first region and wherein the control port has a lowermost portion of the control port is below the first region and wherein the control port has a lowermost portion above the second region.

* * * * *

UNITED STATES PATENT AND TRADEMARK OFFICE
CERTIFICATE OF CORRECTION

PATENT NO. : 6,683,330 B1
DATED : January 27, 2004
INVENTOR(S) : Horch et al.

It is certified that error appears in the above-identified patent and that said Letters Patent is hereby corrected as shown below:

Title page,
Item [56], Reference Cited, OTHER PUBLICATIONS:
"Mark Rodder and D. Yeakley, *Raised Source/Drain MOSFET with Dual Sidewall Spacer* IEEE Electron Device Letters, vol. 12, No. 3, Mar. 1991." should read
-- Mark Rodder and D. Yeakley, *Raised Source/Drain MOSFET with Dual Sidewall Spacers*, IEEE Electron Device Letters, vol. 12, No. 3, Mar. 1991. --
"Plummer, James D. and Scharf, Brad W., *Insulated-Gate Planar Thyristors: I-Structure and basis Operation, pp. 380-386*" should read
-- Plummer, James D. and Scharf, Brad W., *Insulated-Gate Planar Thyristors: I-Structure and Basic Operation*, pp. 380-386, Feb. 1980. --
"Christopher J. Petti, and James D. Plummer, *The Field-Assisted Turn-Off Thristor: A Regenerative Device with Voltage-Controlled Turn-Off.*" should read
-- Christopher J. Petti, and James D. Plummer, *The Field-Assisted Turn-Off Thyristor: A Regenerative Device with Voltage-Controlled Turn-Off*, Aug. 1992. --

Column 1,
Line 5, "10/262,721" should red -- 10/262,729 --.

Column 4,
Line 51, "which control" should read -- which the control --.

Column 9,
Line 52, "in implantation" should read -- ion implatation --.

Column 10,
Lines 49-50, "thethyristor" should read -- the thyristor --.

Signed and Sealed this

Ninth Day of November, 2004

JON W. DUDAS
*Director of the United States Patent and Trademark Office*